United States Patent
Abe

(10) Patent No.: US 7,511,490 B2
(45) Date of Patent: Mar. 31, 2009

(54) MAGNETIC RESONANCE IMAGING APPARATUS AND MAGNETIC RESONANCE IMAGING METHOD

(75) Inventor: Shin-ichi Abe, 10-33-702, Oike 1-chome, Ibaraki-shi, Osaka, 567-0826 (JP)

(73) Assignees: Shin-ichi Abe, Osaka (JP); Hidenao Fukuyama, Kyoto (JP); Sadami Tsutsumi, Kyoto (JP); Baytech Corporation, Hyogo (JP)

( * ) Notice: Subject to any disclaimer, the term of this patent is extended or adjusted under 35 U.S.C. 154(b) by 0 days.

(21) Appl. No.: 11/547,473

(22) PCT Filed: Apr. 5, 2005

(86) PCT No.: PCT/JP2005/006668

§ 371 (c)(1),
(2), (4) Date: Sep. 10, 2007

(87) PCT Pub. No.: WO2005/096929

PCT Pub. Date: Oct. 20, 2005

(65) Prior Publication Data

US 2008/0258723 A1    Oct. 23, 2008

(30) Foreign Application Priority Data

Apr. 5, 2004    (JP)    ............................ 2004-111441

(51) Int. Cl.
*G01V 3/00* (2006.01)
(52) U.S. Cl. ..................................... 324/307; 324/309
(58) Field of Classification Search ......... 324/300–322; 600/410–435
See application file for complete search history.

(56) References Cited

U.S. PATENT DOCUMENTS

| 4,769,603 | A | 9/1988 | Oppelt et al. |
| 4,804,920 | A | 2/1989 | McKinnon |
| 6,339,332 | B1 * | 1/2002 | Deimling ..................... 324/309 |
| 6,587,708 | B2 * | 7/2003 | Venkatesan et al. ......... 600/419 |

(Continued)

FOREIGN PATENT DOCUMENTS

JP    62-44238 A    2/1987

(Continued)

*Primary Examiner*—Dixomara Vargas
(74) *Attorney, Agent, or Firm*—Birch, Stewart, Kolasch & Birch, LLP

(57) ABSTRACT

Generation of an artifact in an image under a transition state up to a steady state is suppressed and image quality is improved by executing the following pulse sequence. In the coherent SSFP method, a gradient magnetic field is applied so that an integrated value of time of a gradient magnetic field in a slice selection direction becomes a predetermined value which is not zero in a repetition time. Specifically, a gradient magnetic field $Gs_2$ for correcting phases of spin dispersed by a gradient magnetic field $Gs_1$ for selecting the slice of an inspected object 40 is applied with an integrated value of time obtained by subtracting a difference value S so as become smaller than a half value of an absolute value of integrated values of time of the gradient magnetic field $Gs_1$. Then, after a reading time, a gradient magnetic field $Gs_3$ to be applied so as to cancel the gradient magnetic fields $Gs_1$ and $Gs_2$ is applied with the same integrated value of time as that of the gradient magnetic field $Gs_2$.

6 Claims, 8 Drawing Sheets

U.S. PATENT DOCUMENTS

| | | | |
|---|---|---|---|
| 7,020,509 B2 * | 3/2006 | Heid | 600/410 |
| 7,230,423 B2 * | 6/2007 | Deimling | 324/307 |
| 2002/0042567 A1 * | 4/2002 | Heid | 600/410 |
| 2003/0030435 A1 * | 2/2003 | Venkatesan et al. | 324/306 |
| 2007/0167733 A1 * | 7/2007 | Miyoshi | 600/410 |

FOREIGN PATENT DOCUMENTS

| | | |
|---|---|---|
| JP | 63-3847 A | 1/1988 |
| JP | 3-99631 A | 4/1991 |
| JP | 6-335471 A | 12/1994 |

* cited by examiner

MAGNETIC RESONANCE IMAGING APPARATUS AND MAGNETIC RESONANCE IMAGING METHOD

TECHNICAL FIELD

The present invention relates to a magnetic resonance imaging apparatus and a magnetic resonance imaging method.

BACKGROUND ART

Magnetic resonance imaging (MRI) apparatuses are utilized for medical applications, industrial applications, and various other fields.

Magnetic resonance imaging apparatuses excite the spin of an object to be inspected placed in a static magnetic field by the nuclear magnetic resonance (NMR) phenomenon and generate a sectional image based on magnetic resonance (MR) signals generated accompanied with the excitation.

In recent years, in magnetic resonance imaging apparatuses, sophisticated imaging methods have been developed along with the advances made in the hardware. Magnetic resonance imaging apparatuses have now been remarkably improved in the technology for the formation of gradient magnetic fields, so shortening of the time of repetition (TR) has become possible. As an imaging method utilizing this, the coherent SSFP (steady state free precession) method is known. The coherent SSFP method is utilized as the imaging methods called the True FISP, Balanced SSFP, FIESTA, etc. In general, in magnetic resonance imaging, shortening of the TR results in the relaxation of the longitudinal magnetization becoming insufficient and lowers the signal intensity, but the coherent SSFP method does not use a spoiler gradient magnetic field, so holds the magnitude of the magnetic moment and makes the phases of transverse magnetization uniform at an intermediate point of time of the RF pulses continuing in the formed steady state, therefore makes an increase of signal intensity of the MR signal etc. possible (see for example Patent Document 1 and Patent Document 2).

Patent Document 1: Japanese Patent No. 2898329
Patent Document 2: Japanese Patent Publication (A) No. 2001-29327

DISCLOSURE OF THE INVENTION

Problem to be Solved by the Invention

In the coherent SSFP method, RF (Radio Frequency) pulses of positive and negative flip angles (±α) are alternately applied in a TR shorter than a transverse relaxation time T2 to set both of the transverse magnetization and the longitudinal magnetization of the magnetic moment to the steady state. Then, in the coherent SSFP method, the integrated values of time are made to become zero during the TR in the gradient magnetic fields in the three directions of the slice selection direction, phase encoding direction, and frequency encoding direction by applying a rewinder gradient magnetic field to all of the different directions of gradient magnetic fields and adjusting the coherence of the transverse magnetization. In the coherent SSFP method, by arranging gradient magnetic fields in three directions symmetric in a time direction with respect to the RF pulse, the change of phase carried to the next TR is made zero to stabilize the steady state and, at the same time, make simultaneous reception of both MR signals of a FID (free induction decay) signal and an echo signal possible.

In the coherent SSFP method described above, due to the short TR, high speed imaging is realized, and an image having a high S/N ratio is obtained because of the collection of MR signals in a stable steady state.

However, the coherent SSFP method requires several tens to several hundreds of milliseconds of time to reach the steady state. For this reason, when applying the coherent SSFP method to short time imaging such as cine imaging of the heart requiring the breathing be stopped, the imaging must be carried out under a transitional state before the steady state is reached. In the initial stage of the imaging, an artifact was conspicuously generated in the image and the image quality was lowered.

FIG. 1 is a diagram showing the orbit of the magnetic moment obtained at the time of TE during the period from the initial state to the transition to the steady state. FIG. 1 shows an xy plane using a static magnetic field direction z vertical to the sheet surface as a normal line, and (a), (b), and (c) show cases where the resonant offset angle is different.

As shown in FIG. 1, the magnetic moment in the coherent SSFP method forms a spiral orbit during the period from the initial state to the transition to the steady state. This is caused from the fact that the resonant offset angle is not zero. This resonant offset angle is also called the "phase angle" or "precession angle". In general, in magnetic resonance imaging, the collection of the MR signal is repeated several times while changing the phase encoding, but when the phase encoding is the same, MR signals must become almost the same. In the coherent SSFP method, however, as described above, the magnetic moment forms a spiral orbit in the transition state before the steady state is reached and largely changes, therefore the MR signals do not become the same, so an artifact is generated.

FIG. 2 is a view showing the state of the artifact generated in the image in the case where the coherent SSFP method is applied to the MR tagging method of the heart.

In the MR tagging method, a tag is added to the image, therefore the steady state of the magnetic moment is destroyed at the time of the addition of the tag. The imaging is then executed. For this reason, as shown in FIG. 2, in the transition state until the steady state is reached after the tag is added, an artifact is generated in the image.

In this way, in the coherent SSFP method, in the transition state before the steady state was reached, an artifact was conspicuously generated in the image, and the image quality was sometimes lowered. Further, along with this, the initial image could not be utilized when carrying out the imaging continuously in a limited time, and the number of imaging images which could be utilized was limited.

Accordingly, an object of the present invention is to provide a magnetic resonance imaging apparatus and a magnetic resonance imaging method able to improve the image quality by suppressing the generation of an artifact in an image in the transition state before the steady state is reached and able to increase the number of the imaging images used when carrying out the imaging continuously.

MEANS FOR SOLVING THE PROBLEM

To attain the above object, the magnetic resonance imaging apparatus of the present invention has a high frequency magnetic field applying means for applying a high frequency magnetic field for exciting a spin of an object to be inspected in a static magnetic field; a gradient magnetic field applying means for applying gradient magnetic fields to a slice selection direction, a phase encoding direction, and a frequency encoding direction of the object to be inspected in the static magnetic field; and an image generating means for generating a sectional image of the object to be inspected based on a magnetic resonance signal from the object to be inspected to which the high frequency magnetic field and the gradient magnetic field are applied, wherein the high frequency magnetic field applying means applies the high frequency magnetic field in a repetition time where both of a transverse magnetization and a longitudinal magnetization of the spin of the object to be inspected become a steady state, and the gradient magnetic field applying means applies gradient magnetic fields in the slice selection direction, the phase encoding direction, and the frequency encoding direction so that they become symmetric in a time direction with respect to the high frequency magnetic field in the repetition time and, at the same time, applies gradient magnetic fields so that an integrated value of time of the gradient magnetic field in each of the phase encoding direction and the frequency encoding direction becomes zero in the repetition time and the integrated value of time of the gradient magnetic field in the slice selection direction becomes a predetermined value which is not zero in the repetition time.

According to the magnetic resonance imaging apparatus of the present invention, the high frequency magnetic field applying means applies the high frequency magnetic field for exciting the spin of the object to be inspected in the static magnetic field. Then, the gradient magnetic field applying means applies gradient magnetic fields to the slice selection direction, the phase encoding direction, and the frequency encoding direction of the object to be inspected in the static magnetic field. Then, the image generating means generates the sectional image of the object to be inspected based on magnetic resonance signals from the object to be inspected to which the high frequency magnetic field and the gradient magnetic field are applied. Here, the high frequency magnetic field applying means applies the high frequency magnetic field in a repetition time where both of the transverse magnetization and the longitudinal magnetization of the spin of the object to be inspected become the steady state. Further, it applies the gradient magnetic fields in the slice selection direction, the phase encoding direction, and the frequency encoding direction so that they become symmetric in the time direction with respect to the high frequency magnetic field in the repetition time. Further, the gradient magnetic field applying means applies the gradient magnetic fields so that the integrated value of time of the gradient magnetic field in each of the phase encoding direction and the frequency encoding direction becomes zero in the repetition time along with that and the integrated value of time of the gradient magnetic field in the slice selection direction becomes a predetermined value which is not zero in the repetition time. In the magnetic resonance imaging apparatus of the present invention, since the gradient magnetic fields are applied so that the integrated value of time of the gradient magnetic field in the slice selection direction becomes a predetermined value which is not zero in the repetition time, therefore phases of the spin are dispersed and equally distributed. For this reason, in the magnetic resonance imaging apparatus of the present invention, a diameter of the spiral orbit of the magnetic resonance signal converged after the excitation becomes small, and the generation of an artifact is suppressed.

To attain the above object, a magnetic resonance imaging method of the present invention comprises applying a high frequency magnetic field for exciting a spin of an object to be inspected to the object to be inspected in a static magnetic field, applying gradient magnetic fields to a slice selection direction, a phase encoding direction, and a frequency encoding direction of the object to be inspected, and generating a sectional image of the object to be inspected based on magnetic resonance signals from the object to be inspected to which the high frequency magnetic field and the gradient magnetic field are applied, wherein: in a step of applying the high frequency magnetic field, the high frequency magnetic field is applied in a repetition time where both of a transverse magnetization and a longitudinal magnetization of the spin of the object to be inspected become a steady state, and in a step of applying the gradient magnetic fields, the gradient magnetic fields to the slice selection direction, the phase encoding direction, and the frequency encoding direction are applied so that they become symmetric in the time direction with respect to the high frequency magnetic field in the repetition time and, at the same time, the gradient magnetic fields are applied so that an integrated value of time of the gradient magnetic field in each of the phase encoding direction and the frequency encoding direction becomes zero in the repetition time, and the integrated value of time of the gradient magnetic field in the slice selection direction becomes a predetermined value which is not zero in the repetition time.

According to the magnetic resonance imaging method of the present invention, the high frequency magnetic field is applied in a repetition time where both of the transverse magnetization and the longitudinal magnetization of the spin of the object to be inspected become the steady state. Then, the gradient magnetic fields to the slice selection direction, the phase encoding direction, and the frequency encoding direction are applied so that they become symmetric in the time direction with respect to the high frequency magnetic field in the repetition time and, at the same time, the gradient magnetic fields are applied so that the integrated value of time of the gradient magnetic field in each of the phase encoding direction and the frequency encoding direction becomes zero in the repetition time, and the integrated value of time of the gradient magnetic field in the slice selection direction becomes a predetermined value which is not zero in the repetition time. In the magnetic resonance imaging apparatus of the present invention, the gradient magnetic fields are applied so that the integrated value of time of the gradient magnetic field in the slice selection direction is a predetermined value which is not zero in the repetition time, therefore phases of the spin are dispersed and equally distributed. For this reason, in the magnetic resonance imaging apparatus of the present invention, the diameter of the spiral orbit of the magnetic resonance signal converged after the excitation becomes small, and the generation of an artifact is suppressed.

EFFECT OF THE INVENTION

According to the present invention, a magnetic resonance imaging apparatus and a magnetic resonance imaging method able to suppress the generation of an artifact in an image under the transition state until the steady state is reached and improve the image quality and able to increase the number of the imaging images utilized in the case where carrying out imaging continuously can be provided.

DESCRIPTION OF NOTATIONS

Figures 1A, 1B, 1C:
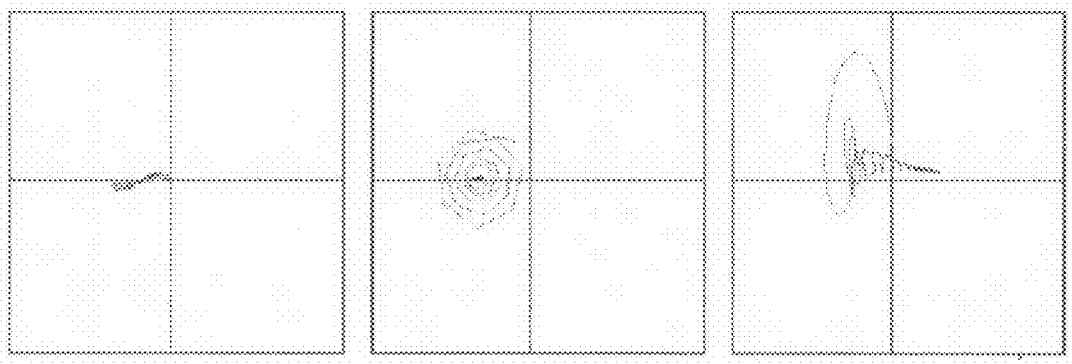
FIG. 1 is a diagram showing an orbit of a magnetic moment during a period from an initial state to a transition to a steady state in the coherent SSFP method.

11 ... imaging space
12 ... static magnetic field magnet unit
13 ... gradient coil unit
14 ... RF coil unit
22 ... RF drive unit
23 ... gradient drive unit
24 ... data collection unit
25 ... control unit
26 ... cradle
31 ... data processing unit
32 ... operation unit
33 ... display unit
101 ... first slice selection direction gradient control unit
102 ... second slice selection direction gradient control unit
103 ... third slice selection direction gradient control unit
104 ... fourth slice selection direction gradient control unit
105 ... fifth slice selection direction gradient control unit
251 ... RF control unit
252 ... gradient control unit
253 ... data collection control unit
331 ... image generation unit

BEST MODE FOR WORKING THE INVENTION

Below, an example of an embodiment according to the present invention will be explained with reference to the drawings.

Figure 3:
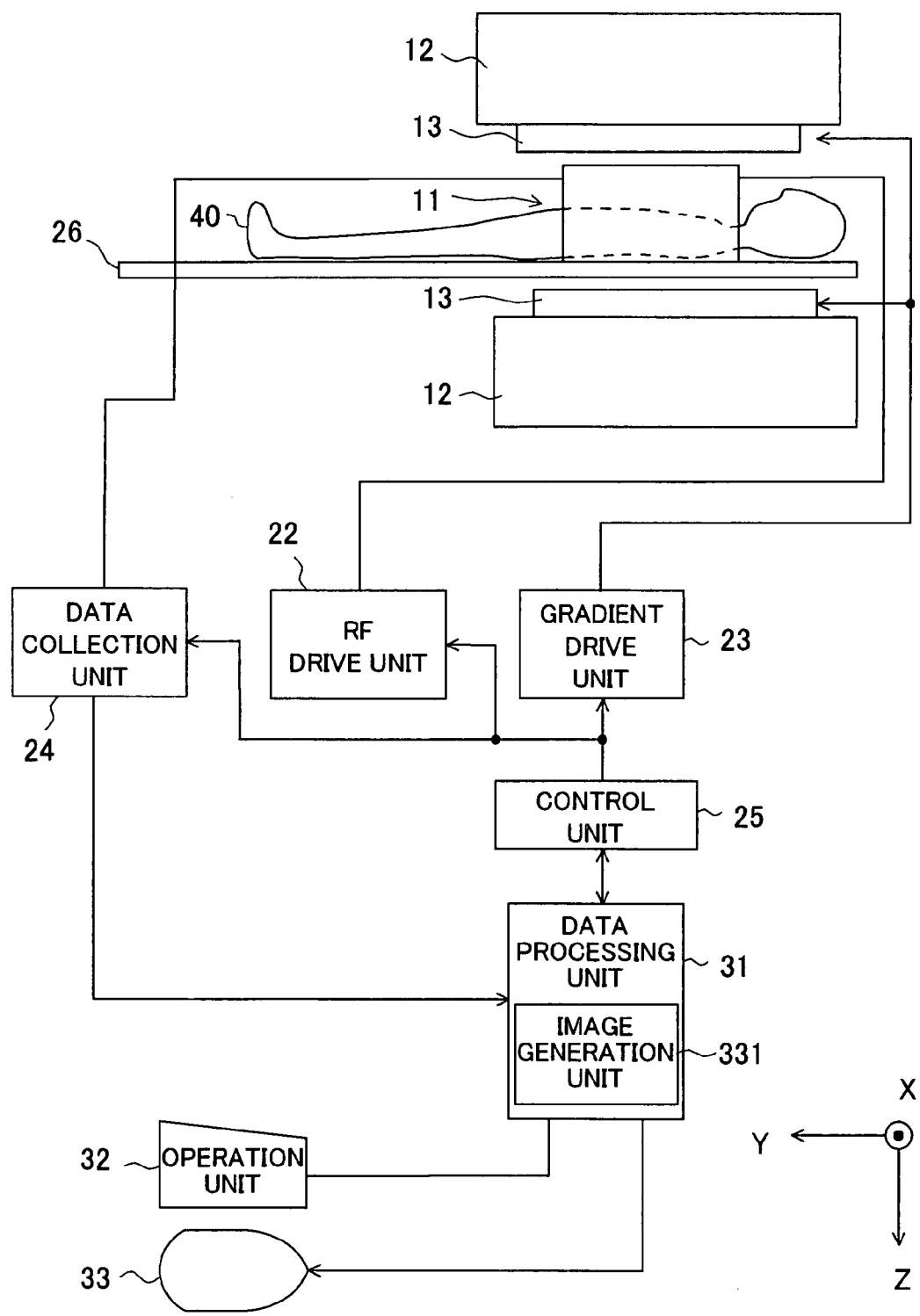
FIG. 3 is a view of the configuration showing the configuration of a magnetic resonance imaging apparatus of an embodiment according to the present invention.

FIG. 3 is a view of the configuration showing the configuration of the magnetic resonance imaging apparatus of the present embodiment.

As shown in FIG. 3, the magnetic resonance imaging apparatus has a static magnetic field magnet unit 12, a gradient coil unit 13, an RF coil unit 14, an RF drive unit 22, a gradient drive unit 23, a data collection unit 24, a control unit 25, a cradle 26, a data processing unit 31, an operation unit 32, and a display unit 33.

Below, the components will be successively explained.

The static magnetic field magnet unit 12 forms a static magnetic field in an imaging space 11 accommodating an inspected object 40 therein. The static magnetic field magnet unit 12 has for example a pair of permanent magnets arranged so as to sandwich the imaging space 11 therebetween and forms the static magnetic field in a direction along a Z-direction vertical with respect to a body axis of the inspected object 40.

The gradient coil unit 13 applies gradient magnetic fields to the inspected object 40 in the imaging space 11 in which the static magnetic field is formed and adds spatial position information to the MR signal received by the RF coil unit 14. Note that the gradient coil unit 13 is configured by three systems and applies gradient magnetic fields to three directions of the slice selection direction, the phase encoding direction, and the frequency encoding direction.

The RF coil unit 14 is arranged so as to sandwich an imaging region of the inspected object 40 and configured so as to act also for transmission and for reception. The RF coil unit 14 applies the high frequency magnetic field by transmitting an RF pulse as an electromagnetic wave in order to excite the spin of protons in the imaging region of the inspected object 40 in the imaging space 11 in which the static magnetic field is formed by the static magnetic field magnet unit 12. Then, the RF coil unit 14 receives the electromagnetic wave generated from the protons in the excited inspected object 40 as the MR signal. Note that the RF coil unit 14 acts also for transmission and for reception in the present embodiment, but a coil for transmission and a coil for reception may be independently provided as well.

The RF drive unit 22 has a gate modulator (not shown), an RF power amplifier (not shown), and an RF oscillator (not shown) in order to drive the RF coil unit 14 and form a high frequency magnetic field in the imaging space 11. The RF drive unit 22 modulates the RF signal from the RF oscillator to a signal of a predetermined timing and a predetermined envelope by using the gate modulator based on a control signal from the control unit 25. Then, the RF signal modulated by the gate modulator is amplified at the RF power amplifier and then output to the RF coil unit 14.

The gradient drive unit 23 drives the gradient coil unit 13 based on a control signal from the control unit 25 and makes the gradient coil unit 13 apply the gradient magnetic fields to the inspected object 40 in the imaging space 11 forming the static magnetic field therein. The gradient drive unit 23 has three systems of drive circuits (not shown) corresponding to the three systems of gradient coils of the gradient coil unit 13.

The data collection unit 24 has a phase detector (not shown) and an analog/digital converter (not shown) and collects MR signals received by the RF coil unit 14 based on a control signal from the control unit 25. The phase detector detects the phase of the MR signal received by the RF coil unit 14 by using the output of the RF oscillator of the RF drive unit 22 as the reference signal and outputs it to the analog/digital converter. Then, the analog/digital converter converts the MR signal as the analog signal output from the phase detector to the digital signal and outputs the result to the data processing unit 31.

The control unit 25 is configured by a computer, outputs control signals to the units, and performs control based on an operation signal input from the operation unit 32 via the data processing unit 31.

Figure 4:
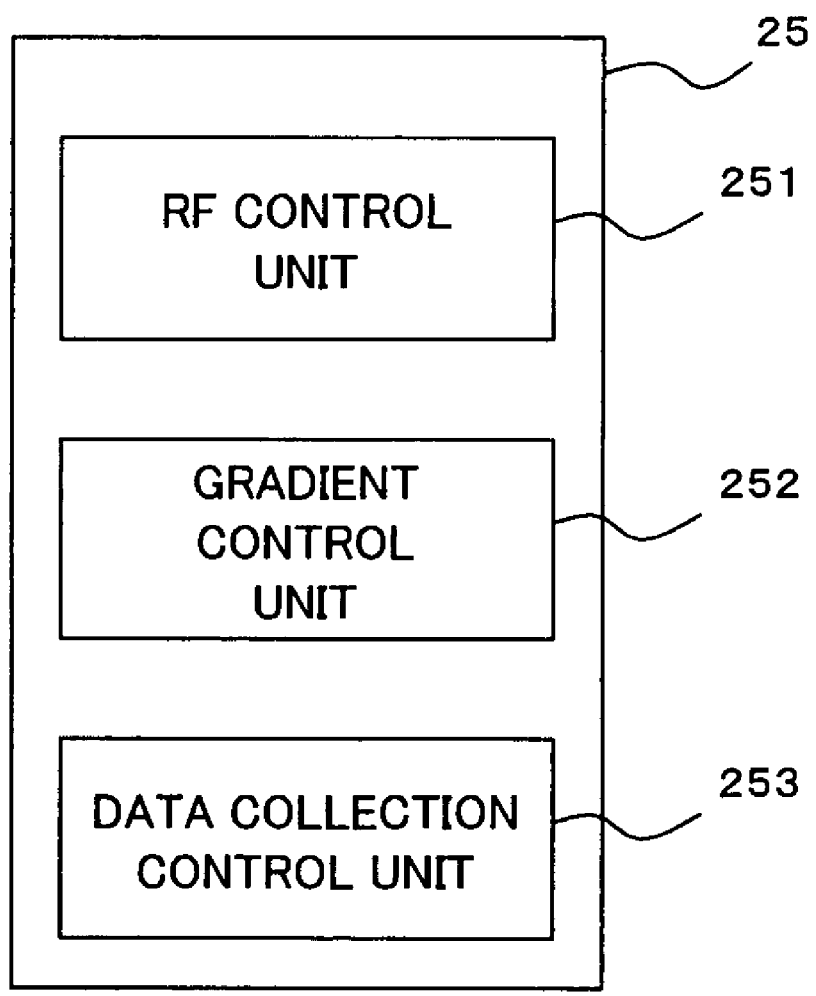
FIG. 4 is a diagram showing the configuration of a control unit in the magnetic resonance imaging apparatus of the embodiment according to the present invention.

FIG. 4 is a diagram showing the configuration of the control unit 25.

As shown in FIG. 4, the control unit 25 has an RF control unit 251, a gradient control unit 252, and a data collection control unit 253. The control unit 25 receives as input an operation signal based on a predetermined pulse sequence from the operation unit 32 via the data processing unit 31.

Then, in the control unit 25, based on the operation signal, the RF control unit 251, the gradient control unit 252, and the data collection control unit 253 output control signals to the RF drive unit 22, the gradient drive unit 23, and the data collection unit 24, apply the high frequency magnetic field and the gradient magnetic fields to the inspected object 40, and collect the MR signals generated from the inspected object. In the present embodiment, the RF control unit 251, the gradient control unit 252, and the data collection control unit 253 output the control signals to the RF drive unit 22, the gradient drive unit 23, and the data collection unit 24 in the pulse sequence based on the coherent SSFP method.

The RF control unit 251 transmits a control signal to the RF drive unit 22 to drive the RF coil unit 14, alternately and repeatedly transmits RF pulses $RF_1$ of positive and negative flip angles ($\pm\alpha$) in a TR where both of the transverse magnetization and the longitudinal magnetization of the spin of the inspected object become the steady state and applies the high frequency magnetic field to the inspected object 40 to set the magnetic moment to the steady state. Further, the RF control unit 251 transmits a control signal to the RF drive unit 22 at a time earlier than the time of repeatedly transmitting the RF pulse $RF_1$ and applying the high frequency magnetic field in that TR by TR/2 to drive the RF coil unit 14 and applies the high frequency magnetic field by a RF pulse $RF_2$ that becomes a second flip angle ($-\alpha/2$) which is a half flip angle of the first flip angle ($\alpha$) of the high frequency magnetic field applied in that TR and has an inverse polarity.

The gradient control unit 252 transmits a control signal to the gradient drive unit 23 to drive the gradient coil unit 13. The gradient control unit 252 applies the gradient magnetic fields to the slice selection direction, the phase encoding direction, and the frequency encoding direction so that they become symmetric in the time direction with respect to the application of the high frequency magnetic field in TR when transmitting the control signal to the gradient drive unit 23 and making the gradient drive unit 23 drive the gradient coil unit 13. The gradient control unit 252 minimizes the change of the phase carried to the next TR and stabilizes the steady state by arranging gradient magnetic fields in three directions symmetric in the time direction with respect to the RF pulses $RF_1$ of positive and negative flip angles ($\pm\alpha$) and enables the simultaneous reception of both MR signals of the FID signal and the echo signal by the data collection unit 24. Here, the gradient control unit 252 applies the gradient magnetic fields so that the integrated value of time of the gradient magnetic field of each of the phase encoding direction and the frequency encoding direction becomes zero in TR and the integrated value in time of the gradient magnetic field of the slice selection direction becomes a predetermined value which is not zero in TR.

Figure 5:
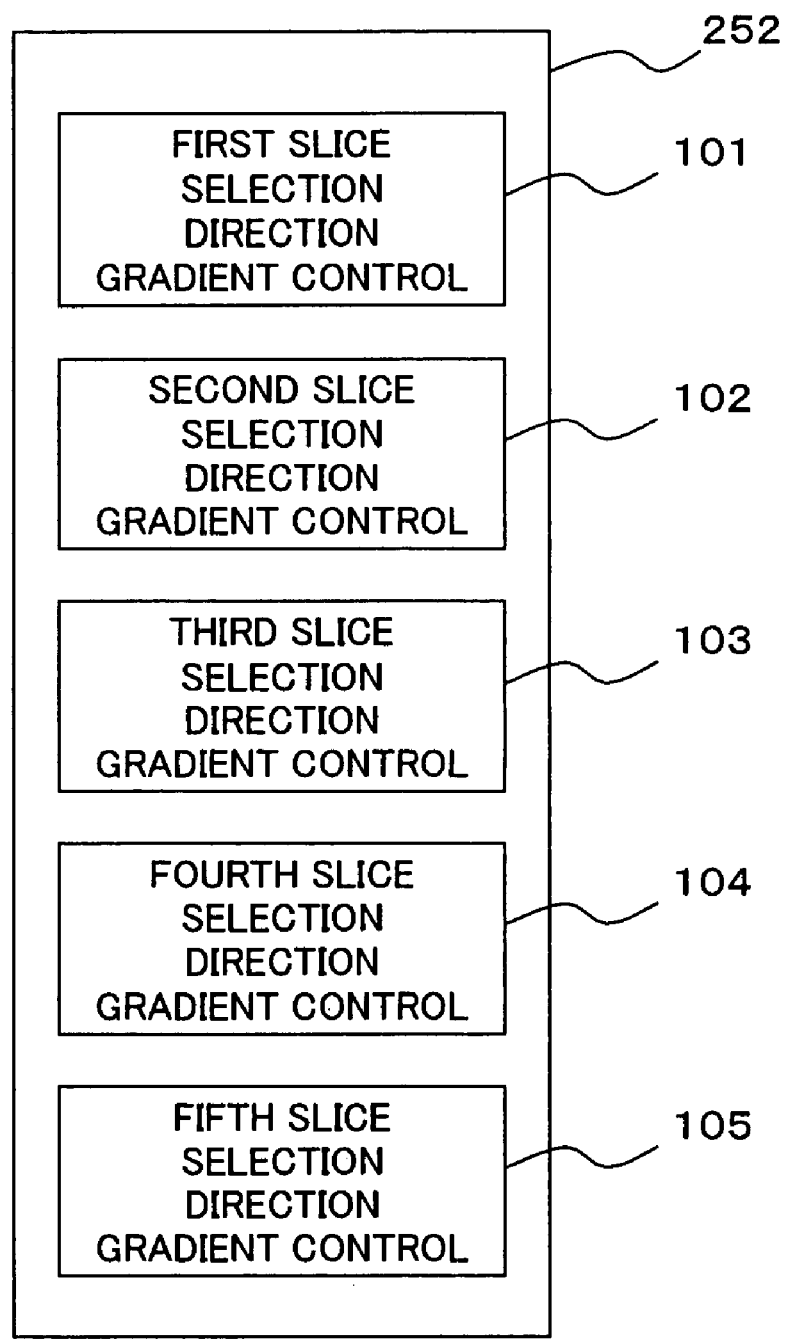
FIG. 5 is a diagram showing the configuration of a gradient control unit in the magnetic resonance imaging apparatus of the embodiment according to the present invention.

FIG. 5 is a diagram showing the configuration of the gradient control unit 252.

As shown in FIG. 5, the gradient control unit 252 has a first slice direction gradient control unit 101, a second slice selection direction gradient control unit 102, a third slice selection direction gradient control unit 103, a fourth slice selection direction gradient control unit 104, and a fifth slice selection direction gradient control unit 105.

The first slice selection direction gradient control unit 101 applies a first slice selection direction gradient magnetic field $Gs_1$ for selecting the slice of the inspected object 40 in the slice selection direction when applying high frequency magnetic fields by the RF pulses $RF_1$ of positive and negative flip angles ($\pm\alpha$) in each TR.

The second slice selection direction gradient control unit 102 applies a second slice selection direction gradient magnetic field $Gs_2$ rephasing and correcting the dispersion of phases of the spin in the inspected object to which the first slice selection direction gradient magnetic field $Gs_1$ was applied before the reading time of the MR signal to the slice selection direction. Here, the second slice selection direction gradient control unit 102 applies the second slice selection direction gradient magnetic field $Gs_2$ with an integrated value of time which is the same integrated value of time as that of a third slice selection direction gradient magnetic field $Gs_3$ mentioned later and obtained by subtracting a difference value S so as to become smaller than a half value of an absolute value of the integrated value of time of the first slice selection direction gradient magnetic field $Gs_1$.

The third slice selection direction gradient control unit 103 applies the third slice selection direction gradient magnetic field $Gs_3$ to the slice selection direction so as to cancel the first slice selection direction gradient magnetic field $Gs_1$ applied from the first slice selection direction gradient control unit 101 and the second slice selection direction gradient magnetic field $Gs_2$ applied by the second slice selection direction gradient control unit 102 after the reading time of the MR signal. The third slice selection direction gradient control unit 103 applies the third slice selection direction gradient magnetic field $Gs_3$ with an integrated value which is the same integrated value of time as that of the second slice selection direction gradient magnetic field $Gs_2$ mentioned before and obtained by subtracting the difference value S so as to become smaller than the half value of the absolute value of integrated values of time of the first slice selection direction gradient magnetic field $Gs_1$.

The fourth slice selection direction gradient control unit 104 applies a fourth slice selection direction gradient magnetic field $Gs_4$ for selecting the slice of the inspected object 40 when the high frequency magnetic field by the RF pulse $RF_2$ of the second flip angle ($\alpha/2$) mentioned above is applied.

The fifth slice selection direction gradient control unit 105 applies a fifth slice selection direction gradient magnetic field $Gs_5$ to the slice selection direction so as to cancel the fourth slice selection direction gradient magnetic field $Gs_4$ applied by the fourth slice selection direction gradient control unit 104. At this time, the fifth slice selection direction gradient control unit 105 applies the fifth slice selection direction gradient magnetic field $Gs_5$ with the integrated value of time obtained by subtracting a value 2 times the difference value S the same as that of the second slice selection direction gradient magnetic field $Gs_2$ and the third slice selection direction gradient magnetic field $Gs_3$ from the absolute value of the integrated values of time of the fourth slice selection direction gradient magnetic field $Gs_4$.

The data collection control unit 253 transmits a control signal to the data collection unit 24 and makes it collect the MR signals received by the RF coil unit 14 and output the MR signals to the data processing unit 31.

The cradle 26 is a stand for placing the inspected object 40. The inspected object 40 can be put into the imaging space 11 and taken out therefrom by a cradle drive unit (not shown).

The data processing unit 31 is configured by a computer. The data processing unit 31 is connected to the operation unit 32 and receives as input the operation signal from the operation unit 32. Further, the data processing unit 31 is connected to the control unit 25 and outputs an operation signal input to the operation unit 32 by an operator to the control unit 25. Further, the data processing unit 31 has an image generation unit 331.

The image generation unit 331 is connected to the data collection unit 24, acquires the MR signals collected and output by the data collection unit 24, performs the image processing with respect to the acquired MR signals, and generates the image data. Then, the data processing unit 31 outputs the image data generated by the image generation unit 331 to the display unit 33.

The operation unit 32 is configured by operation devices such as a keyboard and mouse. The operation unit 32 is operated by the operator and outputs operation signals in accordance with the operation to the data processing unit 31. The operation unit 32 receives as input for example settings of the pulse sequence by the operator.

The display unit 33 is configured by a display device such as a graphic display. The display unit 33 displays a sectional image of the inspected object generated based on the MR signals from the inspected object 40. Here, the display unit 33 acquires the image data from the data processing unit 31 and displays the sectional image based on the image data.

Note that the gradient coil unit 13, the gradient drive unit 23, and the gradient control unit 252 of the present embodiment described above correspond to the gradient magnetic field applying means of the present invention. Further, the RF coil unit 14, the RF drive unit 22, and the RF control unit 251 correspond to the high frequency magnetic field applying means of the present invention. Further, the first slice selection direction gradient control unit 101, the gradient coil unit 13, and the gradient drive unit 23 of the present embodiment correspond to the first gradient magnetic field applying means of the present invention. Further, the second slice selection direction gradient control unit 102, the gradient coil unit 13, and the gradient drive unit 23 of the present embodiment correspond to the second gradient magnetic field applying means of the present invention. Further, the third slice selection direction gradient control unit 103, the gradient coil unit 13, and the gradient drive unit 23 of the present embodiment correspond to the third gradient magnetic field applying means of the present invention. Further, the fourth slice selection direction gradient control unit 104, the gradient coil unit 13, and the gradient drive unit 23 of the present embodiment correspond to the fourth gradient magnetic field applying means of the present invention. Further, the fifth slice selection direction gradient control unit 105, the gradient coil unit 13, and the gradient drive unit 23 of the present embodiment correspond to the fifth gradient magnetic field applying means of the present invention. Further, the image generation unit 331 of the present embodiment corresponds to the image generating means of the present invention. Further, the first slice selection direction gradient magnetic field $Gs_1$ corresponds to the first gradient magnetic field of the present invention. Further, the second slice selection direction gradient magnetic field $Gs_2$ corresponds to the second gradient magnetic field of the present invention. Further, the third slice selection direction gradient magnetic field $Gs_3$ corresponds to the third gradient magnetic field of the present invention. Further, the fourth slice selection direction gradient magnetic field $Gs_4$ corresponds to the fourth gradient magnetic field of the present invention. Further, the fifth slice selection direction gradient magnetic field $Gs_5$ corresponds to the fifth gradient magnetic field of the present invention.

Hereinafter, an explanation will be given of the magnetic resonance imaging method for imaging the sectional image of the inspected object by using the magnetic resonance imaging apparatus of the present embodiment described above.

First, the inspected object 40 is placed on the cradle 26. Thereafter, the RF coil unit 14 is disposed in the imaging region of the inspected object 40. Thereafter, the imaging information based on the predetermined pulse sequence is input to the operation unit 32. Then, the operation unit 32 outputs an operation signal based on the imaging information to the control unit 25 via the data processing unit 31.

Then, the control unit 25 makes the cradle drive unit drive the cradle 26 on which the inspected object 40 is placed in the imaging space 11 forming the static magnetic field therein based on the imaging information input to the operation unit 32 and carries the imaging region of the inspected object 40 into the imaging space 11.

Further, the control unit 25 performs control based on an operation signal based on the predetermined pulse sequence from the operation unit 32 so that the RF control unit 251, the gradient control unit 252, and the data collection control unit 253 output the control signals to the RF drive unit 22, the gradient drive unit 23, and the data collection unit 24 to apply the high frequency magnetic field and the gradient magnetic field to the inspected object 40 and collect the MR signals generated from the inspected object. In the present embodiment, the RF control unit 251, the gradient control unit 252, and the data collection control unit 253 output the control signals to the RF drive unit 22, the gradient drive unit 23, and the data collection unit 24 in the pulse sequence based on the coherent SSFP method.

Figure 6:
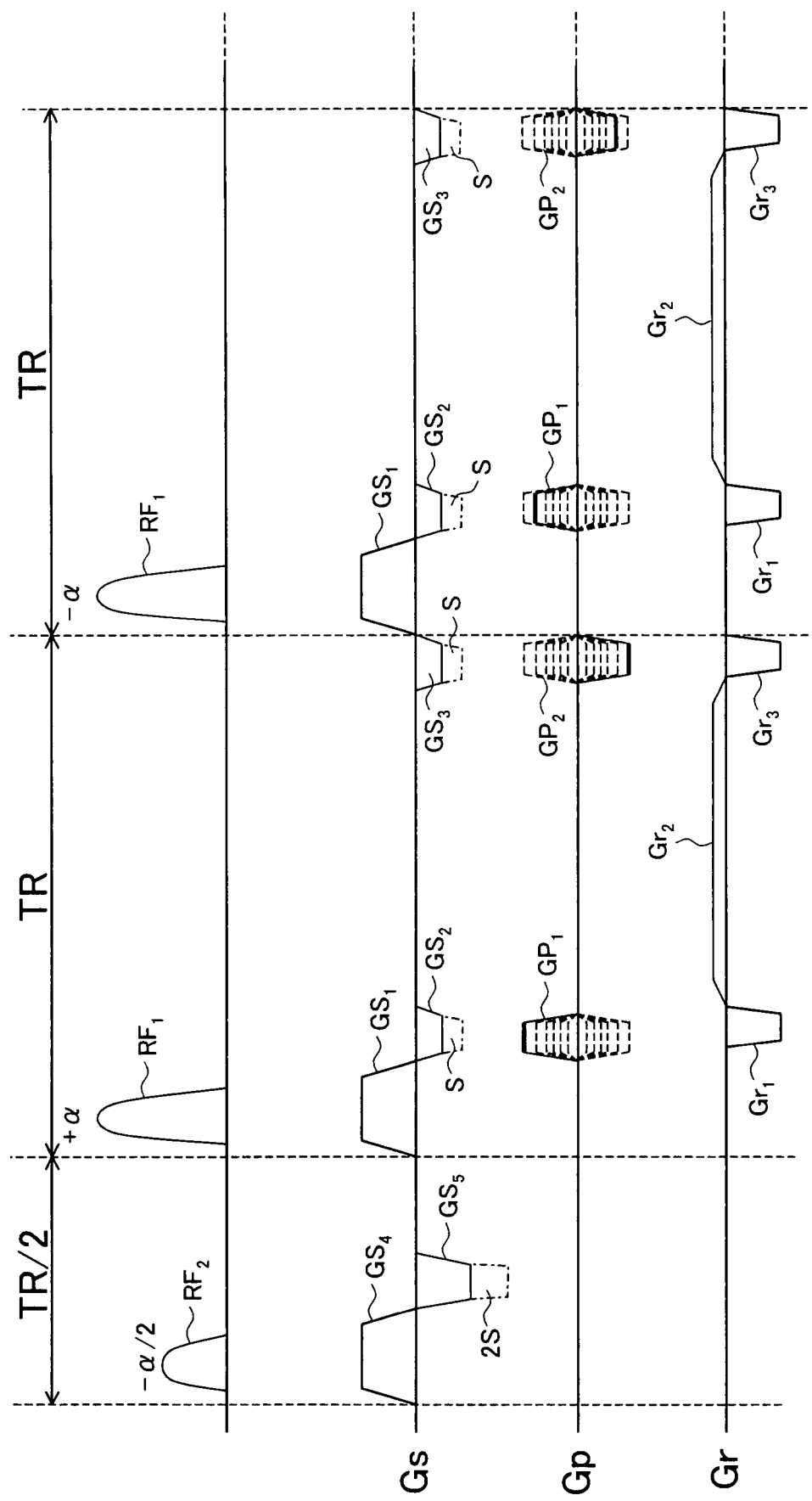
FIG. 6 is a pulse sequence diagram for control by the control unit in the magnetic resonance imaging apparatus of the embodiment according to the present invention.

FIG. 6 is a pulse sequence diagram for the control by the control unit 25. FIG. 6 shows the high frequency magnetic field RF, the gradient magnetic field Gs in the slice selection direction, the gradient magnetic field Gp in the phase encoding direction, and the gradient magnetic field Gr in the frequency encoding direction, in which an ordinate indicates a magnetic field intensity, and an abscissa indicates the time.

As shown in FIG. 6, in the present embodiment, the RF control unit 251 transmits the control signal to the RF drive unit 22 and makes it drive the RF coil unit 14, alternately and repeatedly transmits the RF pulses $RF_1$ of positive and negative flip angles ($\pm\alpha$) for each TR, and applies the high frequency magnetic field to the inspected object 40. At this time, the RF control unit 251 sets the TR in a shorter time than the transverse relaxation time T2 so that the magnetic moment of the spin of the inspected object 40 becomes the steady state.

Here, as shown in FIG. 6, in the TR, the application of the high frequency magnetic field by the RF pulse $RF_1$ of the positive flip angle ($\alpha$) is carried out first. At the application of the RF pulse $RF_1$ of the positive flip angle ($\alpha$), the first slice selection direction gradient magnetic field $Gs_1$ for selecting the slice of the inspected object 40 in the slice selection direction is applied by the first slice selection direction gradient control unit 101. Due to this, the NMR phenomenon occurs, and the spin of the protons of the inspected object 40 is excited and the MR signal is generated.

Next, in order to rephase and correct the dispersion of phases of the spin in the inspected object to which the first slice selection direction gradient magnetic field $Gs_1$ was applied, the second slice selection direction gradient control unit 102 applies the second slice selection direction gradient magnetic field $Gs_2$ to the slice selection direction. Here, the second slice selection direction gradient magnetic field $Gs_2$ is set to the integrated value of time which is the same integrated value of time as that of the third slice selection direction gradient magnetic field $Gs_3$ mentioned later and obtained by subtracting the difference value S so as to become smaller than the half value of the absolute value of integrated values of time of the first slice selection direction gradient magnetic field $Gs_1$. In the present embodiment, in the following Equation (1), the difference value S is set so that $d\theta$ exceeds $0°$ and becomes $360°$ or less. In Equation (1), S is the difference value (mT·μsec/m), L is a slice thickness (mm), $\gamma$ is a magnetic rotation ratio (Hz), and $d\theta$ is an angle (°) of the phase of the spin changing between both ends of the slice thickness L.

Note that, when dθ is made large, the generation of an artifact in the image in the transition state for reaching the steady state can be effectively suppressed, but there is a case where an artifact is generated in the image due to a non-uniformity of the magnetic field. Further, when dθ exceeds 360°, a drop in the signal intensity of the MR signal occurs.

[Equation 1]

$$S = \frac{d\theta}{360 \times 2} \cdot \frac{1000}{\gamma \cdot L} \quad (1)$$

Further, here, at the application of the second slice selection direction gradient magnetic field $Gs_2$, a first phase encoding direction gradient magnetic field $Gp_1$ is applied to the phase encoding direction by the control unit 25, and further a first frequency encoding direction gradient magnetic field $Gr_1$ is applied to the frequency encoding direction. The first phase encoding direction gradient magnetic field $Gp_1$ is applied with the magnetic field intensity corresponding to each phase encoding step and phase encodes the generated MR signal. Then, the first frequency encoding direction gradient magnetic field $Gr_1$ is applied so as to correct the intensity of the MR signal read out in the reading time TS as the application time of the second frequency encoding direction gradient magnetic field $Gr_2$ to be applied later. That is, the first frequency encoding direction gradient magnetic field $Gr_1$ is applied as the gradient magnetic field having the integrated value of time of half of the absolute value of integrated values of time of the second frequency encoding direction gradient magnetic field $Gr_2$ and the inverse polarity and adjusts them so that phases of the spin are dispersed before the reading time TS and the spin has the same phase in the echo time TE as an intermediate time of the time of the reading time TS.

Next, by the control unit 25, the second frequency encoding direction gradient magnetic field $Gr_2$ is applied to the frequency encoding direction. The second frequency encoding direction gradient magnetic field $Gr_2$ is applied with the predetermined magnetic field intensity in the reading time TS and encodes the generated MR signal in frequency. When the second frequency encoding direction gradient magnetic field $Gr_2$ is applied to the frequency encoding direction, the data collection control unit 253 of the control unit 25 transmits the control signal to the data collection unit 24 and makes it collect the MR signals received at the RF coil unit 14 and output the same to the data processing unit 31. Note that, the data collection control unit 253 is alternately and repeatedly transmitted with the RF pulses $RF_1$ of positive and negative flip angles (±α) for each TR, prevents the data collection unit 24 from collecting the MR signals received at the RF coil unit 14 until the steady state of the magnetic moment of the spin of the inspected object 40 is stabilized, and collects the MR signals after the stabilization of the steady state. Specifically, after alternately and repeatedly transmitting the RF pulses $RF_1$ of positive and negative flip angles (±α) for example about two times as dummy pulses for each TR to stabilize the steady state, the data collection unit 24 collects the MR signals.

Next, after the reading time TS of the MR signals, the third slice selection direction gradient control unit 103 applies the third slice selection direction gradient magnetic field $Gs_3$ to the slice selection direction so as to cancel the first slice selection direction gradient magnetic field $Gs_1$ applied by the first slice selection direction gradient control unit 101 and the second slice selection direction gradient magnetic field $Gs_2$ applied by the second slice selection direction gradient control unit 102. That is, the third slice selection direction gradient magnetic field $Gs_3$ is applied by the third slice selection direction gradient control unit 103 as the gradient magnetic field having the integrated value of time which is the same integrated value of time as that of the second slice selection direction gradient magnetic field $Gs_2$ mentioned above obtained by subtracting the difference value S so as to become smaller than the half value of the absolute value of the integrated values of time of the first slice selection direction gradient magnetic field $Gs_1$.

Further, here, at the application of the third slice selection direction gradient magnetic field $Gs_3$, by the control unit 25, the second phase encoding direction gradient magnetic field $Gp_2$ is applied to the phase encoding direction, and further the third frequency encoding direction gradient magnetic field $Gr_3$ is applied to the frequency encoding direction. The second phase encoding direction gradient magnetic field $Gp_2$ is the rewinder gradient magnetic field, makes the integrated value of time of the gradient magnetic field in the phase encoding direction zero during TR, and adjusts the coherence of the transverse magnetization. Further, the third frequency encoding direction gradient magnetic field $Gr_3$ is the rewinder in the same way as the former, makes the integrated value of time of the gradient magnetic field in the frequency encoding direction zero during TR, and adjusts the coherence of the transverse magnetization.

Next, after an elapse of TR from the application of the RF pulse $RF_1$ of the positive flip angle (α), the application of the RF pulse $RF_2$ of the negative flip angle (−α) is carried out, and the same sequence as that described above is repeated several times corresponding to the phase encoding step, the MR signals are collected and the k space is filled.

Note that, as shown in FIG. 6, in the pulse sequence of the present embodiment, before half of the TR (TR/2) from the time when the RF pulse $RF_1$ is first transmitted in TR, an RF pulse $RF_2$ that becomes the second flip angle (−α/2) which is a half flip angle and has an inverse polarity with respect to the first flip angle (α) of the RF pulse $RF_1$ in that TR is previously transmitted, and the high frequency magnetic field is applied. Here, when the RF pulse $RF_2$ of the second flip angle (−α/2) is not previously transmitted, the magnetic moment largely vibrates during a period from 0 to α, therefore a long time is required until it becomes the steady state. However, in the case of the present embodiment where the RF pulse $RF_2$ of the second flip angle (−α/2) is previously transmitted, the magnetic moment changes using the static magnetic field direction Z as the axis between +α/2 and −α/2 by the RF pulse RF1 of the flip angle of α for each TR, therefore a state near the initial state to the steady state is formed.

Then, at the application of the high frequency magnetic field by the RF pulse $RF_2$ of the second flip angle (α/2), the fourth slice selection direction gradient magnetic field $Gs_4$ for selecting the slice of the inspected object 40 is applied to the slice selection direction by the fourth slice selection direction gradient control unit 104. Thereafter, the fifth slice selection direction gradient control unit 105 applies the fifth slice selection direction gradient magnetic field $Gs_5$ to the slice selection direction so as to cancel the fourth slice selection direction gradient magnetic field $Gs_4$ applied by the fourth slice selection direction gradient control unit 104. At this time, the fifth slice selection direction gradient control unit 105 applies the fifth slice selection direction gradient magnetic field $Gs_5$ with the integrated value of time obtained by subtracting the value 2 times the difference value S the same as the second slice selection direction gradient magnetic field $Gs_2$ and the third slice selection direction gradient magnetic field $Gs_3$ from the absolute value of the integrated values of time of the fourth slice selection direction gradient magnetic field $Gs_4$.

In the present embodiment, the present scanning is executed according to the above pulse sequence, but pre-scanning for adjusting the phase of the RF pulse in the present scanning is executed based on the above pulse sequence before the present scanning, and the image for the phase adjustment is generated. Then, the phase of the RF pulse of the present scanning is adjusted based on the image for the phase adjustment generated by the pre-scanning.

FIG. 7 and FIG. 8 are diagrams for explaining the adjustment of the phase of the RF pulse.

Figure 7A:
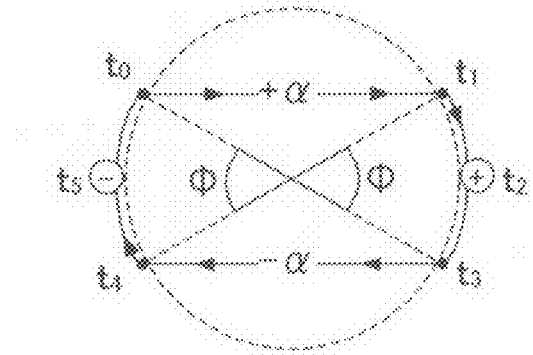
FIG. 7 is a diagram showing the situation of transverse magnetization in the embodiment according to the present invention.
Figure 7B:
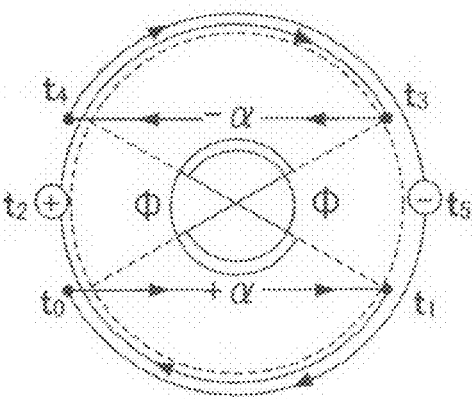

FIG. 7 is a diagram showing the state of the transverse magnetization in the coherent SSFP method. In FIG. 7, FIG. 7A shows a case where the resonant offset angle φ is smaller than 180°, and FIG. 7B shows a case where the resonant offset angle φ is larger than 180°. FIG. 7 shows the xy plane using the static magnetic field direction z as the normal line. In the TR during which the RF pulse of the positive flip angle (+α) is applied, the transverse magnetization changes in a time sequence of $t_0$, $t_1$, and $t_2$, and the MR signals in the positive steady state are collected at the point of time of $t_2$. After that, in the TR during which the RF pulse of the negative flip angle (−α) is applied, the transverse magnetization changes in a time sequence of $t_3$, $t_4$, and $t_5$, and the MR signals in the negative steady state are collected at the point of time of $t_5$.

Figure 8A:
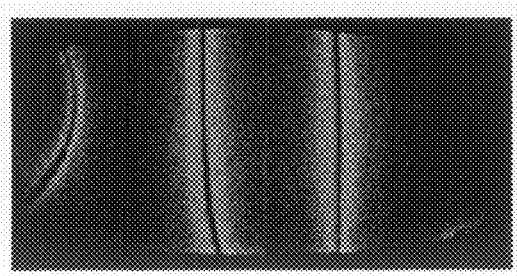
FIG. 8 shows a phantom image showing that a phase of an MR signal is restricted to 0° or 180° during a period up to when the amplitude of the MR signal becomes a variety of values in the coherent SSFP method.
Figure 8B:
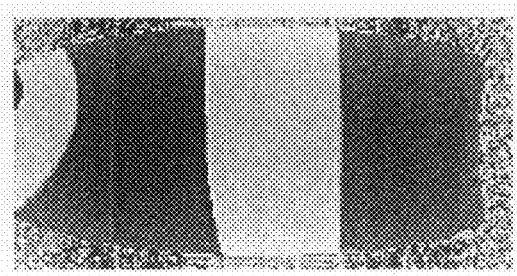

On the other hand, FIG. 8 shows a phantom image showing that the phase of the MR signal is restricted to 0° or 180° during a period where the amplitude of the MR signal becomes a variety of values in the coherent SSFP method. In FIG. 8, FIG. 8A shows the amplitude image of the MR signal, and FIG. 8B shows the phase image.

As shown in FIG. 7, in the coherent SSFP method, phases of continuous RF pulses change by each 180° for each TR. In this case, the MR signals collected at the time of TE by the spin having a resonant offset angle φ within a range from −180° to +180° and the spin having a resonant offset angle φ within a range from −180° to −540° or a range from 180° to 540° are oriented in directions different by 180° in phase from each other. For this reason, as shown in FIG. 8, when the phase of the MR signal inside the slice region is inverted by the gradient magnetic field applied to the slice thickness direction, the MR signal will be cancelled and the signal intensity lowered. Accordingly, in the present embodiment, based on the image for the phase adjustment generated by the pre-scanning, the additional phase increment of the RF pulse is adjusted to a predetermined angle which is not 180°.

After the pre-scanning, the phase of the RF pulse is adjusted, and the present scanning is executed based on the above pulse sequence. By the present scanning, the MR signals collected by the data collection unit 24 are output to the image generation unit 331 of the data processing unit 31. Then, the image generation unit 331 performs the image processing with respect to the MR signals and generates the image data. Then, the image data generated by the image generation unit 331 is output to the display unit 33 by the data processing unit 31. The display unit 33 displays the sectional image of the inspected object 40 based on the image data from the data processing unit 31.

The method of imaging by the pulse sequence as described above will be called the TARD (transient artifact reduction with dephasing of phase).

Figure 9:
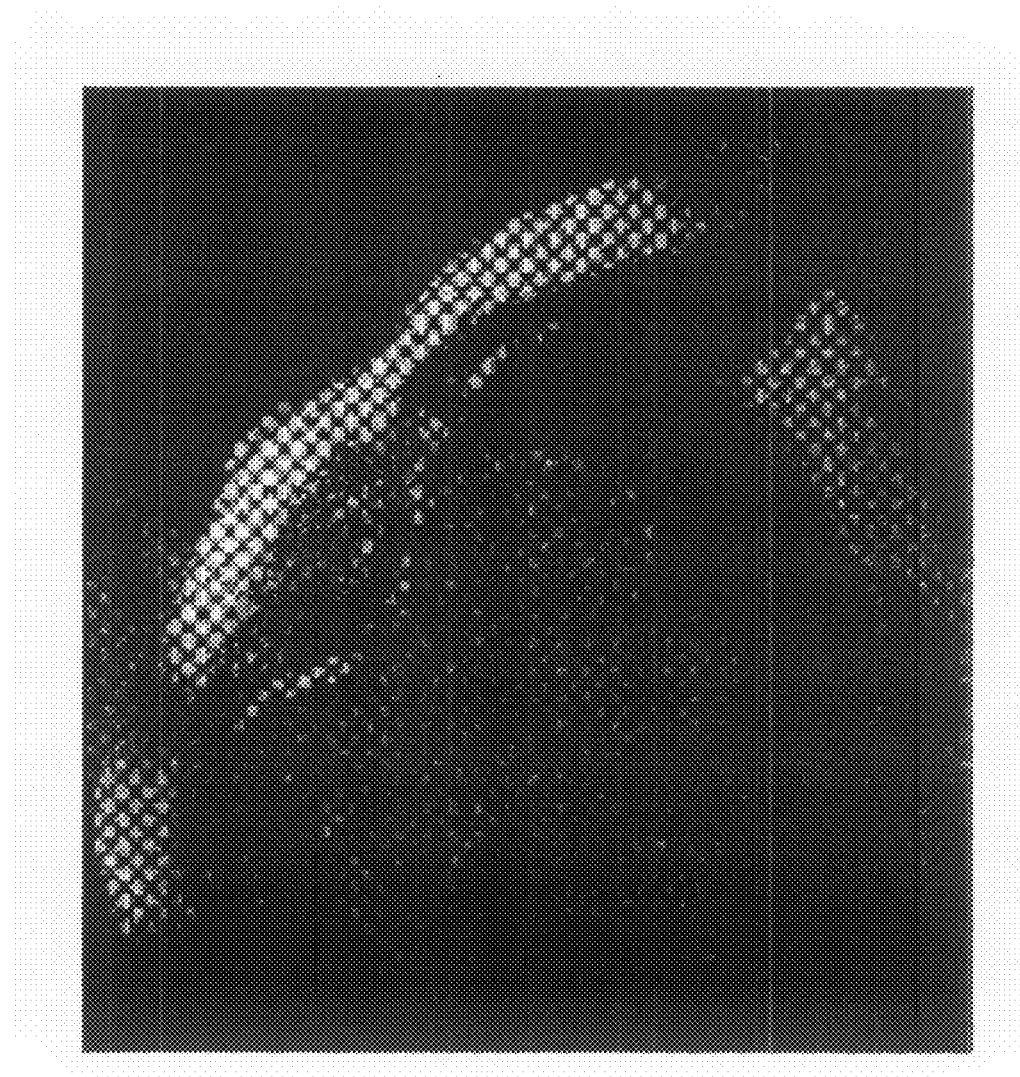
FIG. 9 is a diagram showing an image generated when the embodiment according to the present invention is applied to the MR tagging method of the heart.

FIG. 9 is a diagram showing the image generated in the case where the present embodiment is applied to the MR tagging method of the heart.

Figure 2:
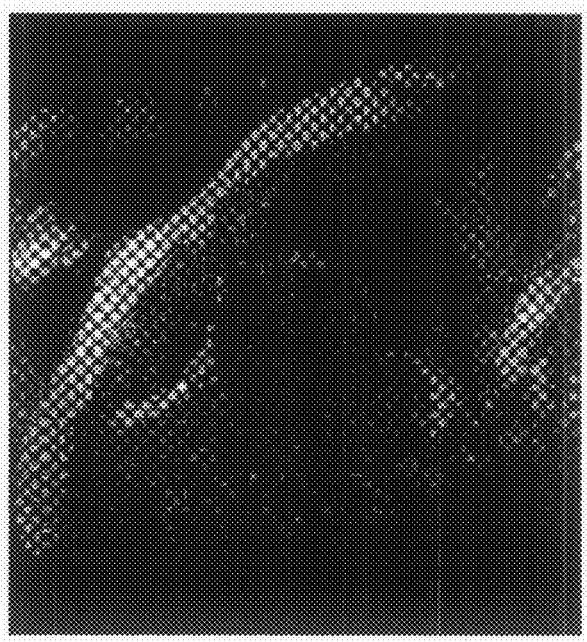
FIG. 2 is a diagram showing a state of an artifact generated in an image in a case where the coherent SSFP method is applied to an MR tagging method of the heart.

As explained before, in the MR tagging method, a tag is added to the image, so the steady state of the magnetic moment is destroyed at the time of addition of the tag. After that, the imaging is executed. Therefore, as shown in FIG. 2, in the transition state up to the steady state, an artifact is conspicuously generated in the image.

However, as shown in FIG. 9, in the present embodiment, in the transition state until the steady state after the addition of the tag is reached, no artifact is generated in the image and the image quality is improved. Along with this, the present embodiment can utilize the initial image in the case where images are continuously imaged in a limited imaging time and can increase the number of the images which can be utilized.

Figure 10A:
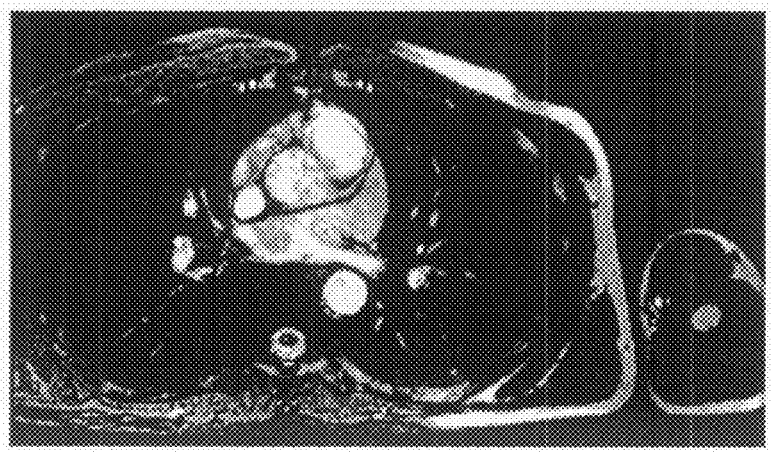
FIG. 10 is a diagram showing the image generated in a case where a portion including the aorta is imaged.
Figure 10B:
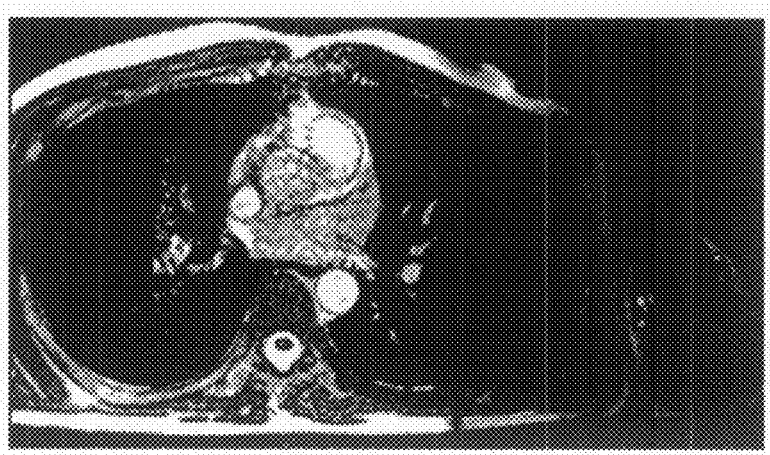

FIG. 10 is a diagram showing an image on which a portion of the aorta is imaged. In FIG. 10, FIG. 10A is a diagram showing the image generated in the present embodiment, and FIG. 10B is a diagram showing the image generated by the conventional coherent SSFP method.

As shown in FIG. 10, in the present embodiment, the artifact produced from the blood flowing into the imaging plane is reduced. Specifically, as shown in FIG. 10B, in the conventional coherent SSFP method, an artifact is generated in the phase encoding direction at the position where the blood flows into the imaging plane, but as shown in FIG. 10A, this artifact is reduced in the present embodiment. Further, the present embodiment is effective also for suppressing the adiposus as seen from the suppression of the panniculus adiposus.

As described above, according to the above present embodiment, in the coherent SSFP method, the gradient magnetic field is applied so that the integrated value of time of the gradient magnetic field in the slice selection direction becomes a predetermined value which is not zero in the repetition time. That is, in the present embodiment, in the coherent SSFP method, the second slice selection direction gradient magnetic field $Gs_2$ for correcting the phase of the spin dispersed by the first slice selection direction gradient magnetic field $Gs_1$ for selecting the slice of the inspected object 40 is applied with the integrated value of time obtained by subtracting the difference value S so as to become smaller than the half value of the absolute value of the integrated values of time of the first slice selection direction gradient magnetic field $Gs_1$. Then, further, in the present embodiment, after the reading time, the third slice selection direction gradient magnetic field $Gs_3$ to be applied so as to cancel the first slice selection direction gradient magnetic field $Gs_1$ and the second slice selection direction gradient magnetic field $Gs_2$ is applied with the same integrated value of time as that of the second slice selection direction gradient magnetic field $Gs_2$ in the same way as the former. Further, before the TR, when use is made of the RF pulse $RF_2$ of the second flip angle (−α/2) which is the half flip angle of the RF pulse $RF_1$ of the first flip angle (α) and has inverse polarity, the fifth slice selection direction gradient magnetic field $Gs_5$ for canceling the fourth slice selection direction gradient magnetic field $Gs_4$ is applied with the integrated value of time obtained by subtracting the same difference value S as that of the second slice selection direction gradient magnetic field $Gs_2$ and the third slice selection direction gradient magnetic field $Gs_3$ from the absolute value of the integrated values of time of the fourth slice selection direction gradient magnetic field $Gs_4$.

For this reason, in the present embodiment, resonant offset angles of the spin are dispersed and equally distributed in TR. In the MR signals comprised of the sum of signals from the spin in the voxels, the spiral orbits different for each resonant offset angle are averaged. Therefore, as a result, the diameter of the spiral orbit becomes small. Particularly, in the present embodiment, the resonant offset angles of the spin are equally distributed in the slice selection direction, therefore MR signals can be effectively collected. Further, in the present embodiment, the gradient magnetic field in the slice selection direction functions as the spoiler with respect to spin other than the slice region, therefore, for example, the transverse magnetization of the spin other than the slice region like spin labeling perfusion can be erased. For this reason, in the present embodiment, the generation of an artifact under the transition state up to the steady state is suppressed, and the image quality can be improved. Along with this, in the present embodiment, in the case where images are continuously imaged in a limited imaging time, the initial image can be utilized, and the number of useable images can be increased.

Note that when working the present invention, the invention is not limited to the above embodiment. Various modifications can be employed.

For example, the present embodiment shows the pulse sequence for two dimensions, but a phase encoding step, that is, a slice encoding step, may be added to the slice selection direction and applied for three dimensions as well.

Further, in the present embodiment, before half of the TR (TR/2) from the time of transmitting the RF pulse $RF_1$ at first in TR, the RF pulse $RF_2$ of the second flip angle $(-\alpha/2)$ is previously transmitted and the high frequency magnetic field is applied, but the present invention is not limited to this. For example, the present invention can also be applied in the case where this RF pulse $RF_2$ of the second flip angle $(-\alpha/2)$ is not previously transmitted.

The invention claimed is:

1. A magnetic resonance imaging apparatus having:
   a high frequency magnetic field applying means for applying a high frequency magnetic field for exciting a spin of an object to be inspected in a static magnetic field;
   a gradient magnetic field applying means for applying gradient magnetic fields to a slice selection direction, a phase encoding direction, and a frequency encoding direction of the object to be inspected in the static magnetic field; and
   an image generating means for generating a sectional image of the object to be inspected based on a magnetic resonance signal from the object to be inspected to which the high frequency magnetic field and the gradient magnetic field are applied, wherein
   the high frequency magnetic field applying means applies the high frequency magnetic field in a repetition time where both of a transverse magnetization and a longitudinal magnetization of the spin of the object to be inspected become a steady state, and
   the gradient magnetic field applying means applies gradient magnetic fields in the slice selection direction, the phase encoding direction, and the frequency encoding direction so that they become symmetric in a time direction with respect to the high frequency magnetic field in the repetition time and, at the same time, applies gradient magnetic fields so that an integrated value of time of the gradient magnetic field in each of the phase encoding direction and the frequency encoding direction becomes zero in the repetition time and the integrated value of time of the gradient magnetic field in the slice selection direction becomes a predetermined value which is not zero in the repetition time.

2. A magnetic resonance imaging apparatus as set forth in claim 1, wherein said gradient magnetic field applying means has
   a first gradient magnetic field applying means for applying a first gradient magnetic field for selecting a slice of the inspected object in the slice selection direction when applying high frequency magnetic fields with said repetition time,
   a second gradient magnetic field applying means for applying a second gradient magnetic field for correcting dispersion of phases of the spin in the inspected object to which the first gradient magnetic field was applied before the reading time for reading the magnetic resonance signal in said slice selection direction, and
   a third gradient magnetic field applying means for applying a third gradient magnetic field applies the third gradient magnetic field to the slice selection direction so as to cancel the applied first gradient magnetic field and the applied second gradient magnetic field after the reading time, wherein
   said second gradient magnetic field applying means and said third gradient magnetic field applying means apply the second gradient magnetic field and the third gradient magnetic field by integrated values of times which are the same and are obtained by subtracting a difference value so as to become smaller than a half value of an absolute value of the integrated value of time of the first gradient magnetic field.

3. A magnetic resonance imaging apparatus as set forth in claim 2, wherein
   said high frequency magnetic field applying means forms a high frequency magnetic field of a second flip angle of an inverse polarity comprising a flip angle of half of a first flip angle of said high frequency magnetic field first applied in said repetition time before applying said high frequency magnetic field in said repetition time,
   said gradient magnetic field applying means has a fourth gradient magnetic field applying means for applying a fourth gradient magnetic field selecting a slice of said inspected object to said slice selection direction when a high frequency magnetic field of said second flip angle is applied and
   a fifth gradient magnetic field applying means for applying a fifth gradient magnetic field to said slice selection direction so as to cancel the applied fourth gradient magnetic field; and
   said fifth gradient magnetic field applying means applies said fifth gradient magnetic field by an integrated value of time obtained by subtracting a value of twice said difference value from an absolute value of the integrated value of time of the fourth gradient magnetic field.

4. A magnetic resonance imaging method comprising applying a high frequency magnetic field for exciting a spin of an object to be inspected to the object to be inspected in a static magnetic field, applying gradient magnetic fields to a slice selection direction, a phase encoding direction, and a frequency encoding direction of the object to be inspected, and generating a sectional image of the object to be inspected based on magnetic resonance signals from the object to be inspected to which the high frequency magnetic field and the gradient magnetic field are applied, wherein:
   in a step of applying the high frequency magnetic field, the high frequency magnetic field is applied in a repetition time where both of a transverse magnetization and a longitudinal magnetization of the spin of the object to be inspected become a steady state, and in a step of applying the gradient magnetic fields, the gradient magnetic fields to the slice selection direction, the phase encoding direction, and the frequency encoding direction are applied so that they become symmetric in the time direction with respect to the high frequency magnetic field in the repetition time and, at the same time, the gradient magnetic fields are applied so that an integrated value of time of the gradient magnetic field in each of the phase encoding direction and the frequency encoding direction becomes zero in the repetition time, and the integrated value of time of the gradient magnetic field in the slice selection direction becomes a predetermined value which is not zero in the repetition time.

5. A magnetic resonance imaging method as set forth in claim 4, wherein said step of forming a gradient magnetic field has a first gradient magnetic field applying step of applying a first gradient magnetic field for selecting a slice of the inspected object in the slice selection direction when applying high frequency magnetic fields with said repetition time, a second gradient magnetic field applying step of applying a second gradient magnetic field for correcting dispersion of phases of the spin in the inspected object to which the first gradient magnetic field was applied before the reading time for reading the magnetic resonance signal in said slice selection direction, and a third gradient magnetic field applying step of applying a third gradient magnetic field applies the third gradient magnetic field to the slice selection direction so as to cancel the applied first gradient magnetic field and the applied second gradient magnetic field after the reading time, wherein said second gradient magnetic field applying step and said third gradient magnetic field applying step apply the second gradient magnetic field and the third gradient magnetic field by integrated values of times which are the same and are obtained by subtracting a difference value so as to become smaller than a half value of an absolute value of the integrated value of time of the first gradient magnetic field.

6. A magnetic resonance imaging method as set forth in claim 5, wherein said high frequency magnetic field applying step forms a high frequency magnetic field of a second flip angle of an inverse polarity comprising a flip angle of half of a first flip angle of said high frequency magnetic field first applied in said repetition time before applying said high frequency magnetic field in said repetition time, said gradient magnetic field applying step has a fourth gradient magnetic field applying step for applying a fourth gradient magnetic field selecting a slice of said inspected object to said slice selection direction when a high frequency magnetic field of said second flip angle is applied and a fifth gradient magnetic field applying step for applying a fifth gradient magnetic field to said slice selection direction so as to cancel the applied fourth gradient magnetic field; and said fifth gradient magnetic field applying step applies said fifth gradient magnetic field by an integrated value of time obtained by subtracting a value of twice said difference value from an absolute value of the integrated value of time of the fourth gradient magnetic field.

* * * * *